US012666952B2

(12) United States Patent
Guo

(10) Patent No.: US 12,666,952 B2
(45) Date of Patent: Jun. 23, 2026

(54) METHOD FOR MANUFACTURING SEMICONDUCTOR DEVICE AND SEMICONDUCTOR DEVICE

(71) Applicant: CHANGXIN MEMORY TECHNOLOGIES, INC., Hefei City (CN)

(72) Inventor: Shuai Guo, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 429 days.

(21) Appl. No.: 18/314,844

(22) Filed: May 10, 2023

(65) Prior Publication Data

US 2023/0282572 A1     Sep. 7, 2023

Related U.S. Application Data

(63) Continuation of application No. PCT/CN2021/138457, filed on Dec. 15, 2021.

(30) Foreign Application Priority Data

Oct. 28, 2021     (CN) .......................... 202111264789.8

(51) Int. Cl.
*H10W 20/43*          (2026.01)
*H10W 20/00*          (2026.01)
*H10B 12/00*          (2023.01)

(52) U.S. Cl.
CPC ......... *H10W 20/43* (2026.01); *H10W 20/056* (2026.01); *H10W 20/081* (2026.01); *H10B 12/482* (2023.02); *H10B 12/488* (2023.02)

(58) Field of Classification Search
CPC ............. H01L 23/528; H01L 21/76802; H01L 21/76877; H01L 23/538; H01L 21/76897;
(Continued)

(56) References Cited

U.S. PATENT DOCUMENTS

2017/0330882 A1*  11/2017  Wang ................ H01L 21/31144
2021/0358917 A1*  11/2021  Kwon ..................... H01L 23/64

FOREIGN PATENT DOCUMENTS

CN          108520876 A       9/2018
CN          111048467 A       4/2020
(Continued)

OTHER PUBLICATIONS

International Search Report in the international application No. PCT/CN2021/138457, mailed on Jul. 27, 2022, 5 pages.

*Primary Examiner* — Patricia D Valenzuela
(74) *Attorney, Agent, or Firm* — Syncoda LLC; Feng Ma

(57) ABSTRACT

A method for manufacturing a semiconductor device includes following operations. A substrate is provided, including memory array region. A plurality of bit lines are formed in memory array region. First insulating material is filled between the plurality of bit lines. A plurality of trenches intersecting with bit lines are provided in first insulating material. Memory array region includes inner region and boundary region outside same. Second insulating material is filled in trenches to form spacing lines. Second insulating material is also deposited above bit lines, spacing lines and first insulating material to form cap material layer. Etching process is performed to form node contact holes, including following operations. Cap material layer is etched to form cap layer covering bit lines, spacing lines and first insulating material in boundary region. First insulating material in inner region is removed by etching with cap layer as mask to from node contact holes.

6 Claims, 10 Drawing Sheets

(58) Field of Classification Search
CPC . H01L 23/5386; H10B 12/482; H10B 12/488; H10B 12/09; H10B 12/053; H10B 12/315; H10B 12/50; H10W 20/43; H10W 20/056; H10W 20/081; H10W 70/60; H10W 70/611; H10W 20/069; H10W 70/65
See application file for complete search history.

(56) References Cited

FOREIGN PATENT DOCUMENTS

| | | | |
|---|---|---|---|
| CN | 113097142 | A | 7/2021 |
| CN | 113192954 | A | 7/2021 |
| JP | 2013229468 | A | 11/2013 |

* cited by examiner

METHOD FOR MANUFACTURING SEMICONDUCTOR DEVICE AND SEMICONDUCTOR DEVICE

CROSS-REFERENCE TO RELATED APPLICATIONS

This is a continuation of International Patent Application No. PCT/CN2021/138457, filed on Dec. 15, 2021, which claims priority to Chinese Patent Application No. 202111264789.8, filed on Oct. 28, 2021. The disclosures of International Patent Application No. PCT/CN2021/138457 and Chinese Patent Application No. 202111264789.8 are hereby incorporated by reference in their entireties.

BACKGROUND

Due to the influence of Pattern Loading Effects in an etching process, there is a certain difference between the pattern density of the boundary region and that of the inner region in the memory array region, which makes the consistency between the node contact holes formed in boundary region and those formed in the inner region poor. Therefore, in the related art, when the node contact holes are formed, the node contact holes originally to be formed in the boundary region are made into dummy contact holes, which do not serve as part of the circuit, thus avoiding the problems caused by poor consistency of the node contact holes.

However, the process flow of manufacturing the node contact holes by the above-mentioned method of the related art is too complex, and the output efficiency of chips is not high.

SUMMARY

The disclosure relates to the field of semiconductor manufacturing, and in particular to a method for manufacturing a semiconductor device and a semiconductor device.

Embodiments of the disclosure provide a method for manufacturing a semiconductor device, including the following operations. A substrate is provided. The substrate includes a memory array region. A plurality of bit lines are formed in the memory array region. A first insulating material is filled between the plurality of bit lines. A plurality of trenches intersecting with the bit lines are provided in the first insulating material. The memory array region includes an inner region and a boundary region located outside the inner region.

A second insulating material is filled in the trenches to form spacing lines. The second insulating material is also deposited above the bit lines, the spacing lines and the first insulating material to form a cap material layer.

An etching process is performed to form node contact holes, which includes the following operations. The cap material layer is etched to form a cap layer covering the bit lines, the spacing lines and the first insulating material in the boundary region. The first insulating material in the inner region is removed by etching with the cap layer as a mask to from the node contact holes.

Embodiments of the disclosure further provide a semiconductor device, including a substrate, a plurality of bit lines, a plurality of spacing lines, a first insulating material and a cap layer. The substrate includes a memory array region. The memory array region includes an inner region and a boundary region located outside the inner region.

The plurality of bit lines are located in the memory array region.

The plurality of spacing lines are located in the memory array region and intersect with the plurality of bit lines to form a plurality of hole structures. The hole structures located in the inner region are node contact holes.

The first insulating material is filled in the hole structures in the boundary region.

The cap layer covers the bit lines, the spacing lines, and the first insulating material in the boundary region.

BRIEF DESCRIPTION OF THE DRAWINGS

To more clearly illustrate the technical solutions in the embodiments of the disclosure, the drawings to be used in the embodiments will be briefly described below. It will be apparent that the drawings described below are only some embodiments of the disclosure, from which other drawings can also be obtained without creative effort by a person of ordinary skill in the art.

DETAILED DESCRIPTION

Figure 1:
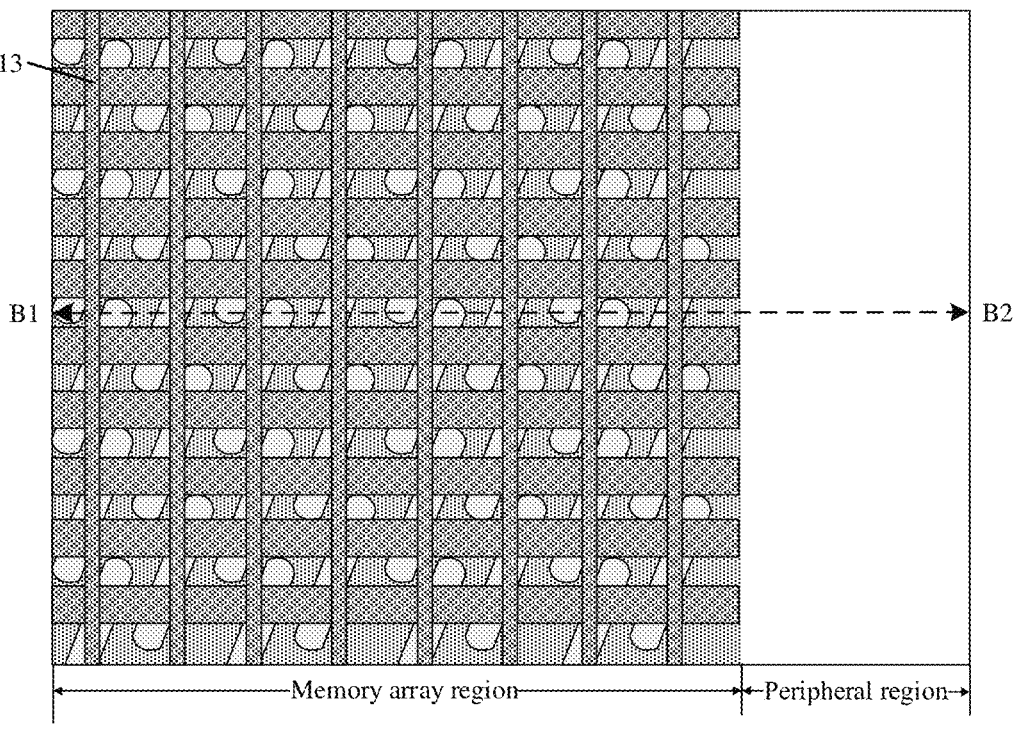
FIG. 1 is a top-view schematic diagram of an exemplary semiconductor device.

Exemplary implementations of the disclosure will be described in more detail below with reference to the accompanying drawings. Although the exemplary implementations of the disclosure are shown in the accompanying drawings, it should be understood that the disclosure may be implemented in various forms, and shall not be limited by the specific implementations set forth herein. On the contrary, these implementations are provided to enable a more thorough understanding of the disclosure and to fully convey the scope of the disclosure to those skilled in the art.

In the following description, numerous specific details are given to provide a more thorough understanding of the disclosure. However, it will be apparent to those skilled in the art that the disclosure may be practiced without one or more of these details. In other examples, some technical features well known in the art are not described in order to avoid confusion with the disclosure. That is, not all features of the actual embodiments are described herein, and well-known functions and structures are not described in detail.

In the figures, the dimensions of layers, regions, elements and their relative dimensions may be exaggerated for clarity. The same reference numerals denote the same elements throughout.

It should be understood that when an element or layer is referred to as being "above", "adjacent to", "connected to" or "coupled to" another element or layer, it may be directly above, adjacent to, connected to, or coupled to the other element or layer, or intervening elements or layers may exist. Conversely, when an element is referred to as being "directly above", "directly adjacent to", "directly connected to" or "directly coupled to" another element or layer, there is no intervening element or layer. It should be understood that, although the terms first, second, third, etc. may be used to describe various elements, components, regions, layers, and/or portions, the elements, components, regions, layers, and/or portions shall not be limited by such terms. These terms are used only to distinguish one element, component, region, layer, or portion from another element, component, region, layer, or portion. Thus, a first element, component, region, layer, or portion discussed below may be represented as a second element, component, region, layer, or portion without departing from the teachings of the disclosure. The discussion of a second element, component, region, layer or portion does not imply that a first element, component, region, layer or portion is necessarily present in the disclosure.

Spatially relational terms such as "below", "under", "lower", "beneath", "above", and "upper" may be used herein for conveniently describing a relationship between one element or feature and another element or feature illustrated in the figures. It is to be understood that, in addition to the orientations shown in the figures, the spatially relational terms are intended to further include different orientations of a device in use and operation. For example, if the device in the figures are turned over, elements or features described as being "under" or "beneath" or "below" other elements or features will be oriented to be "on" the other elements or features. Therefore, the exemplary terms "under" and "below" may include both upper and lower orientations. The device may be additionally oriented (rotated by 90 degrees or otherwise), and the spatial descriptors used herein are interpreted accordingly.

The terminology used herein is intended to describe specific embodiments only and is not to be a limitation of the disclosure. As used herein, the singular forms "a", "an" and "said/the" are also intended to include the plural forms, unless the context clearly indicates otherwise. It should also be understood that the terms "compose" and/or "include", when used in this specification, determine the presence of said features, integers, steps, operations, elements and/or components, but do not exclude the presence or addition of one or more other features, integers, steps, operations, elements, components and/or groups. As used herein, the term "and/or" includes any and all combinations of related listed items.

In a process of forming a semiconductor device, such as a memory, due to the influence of Pattern Loading Effects in an etching process, there is a certain difference between a pattern density of an inner region and that of a boundary region in a memory array region, which makes the consistency between the node contact holes finally formed in the inner region and those formed in the boundary region poor, and thus affects the electrical quality of the device.

Figure 2A:
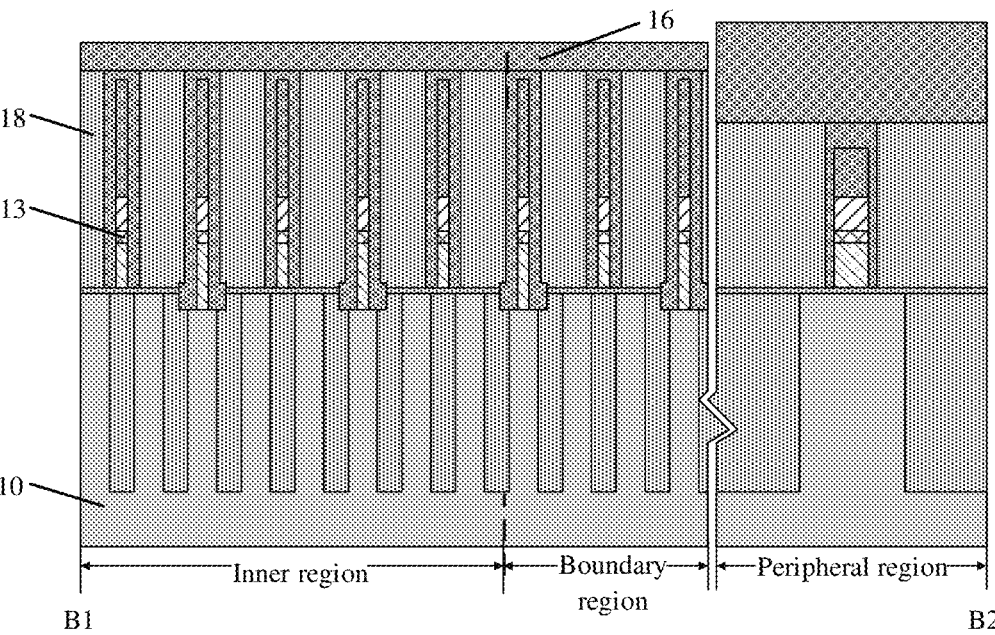
FIGS. 2A-2D are detailed sectional views of the exemplary semiconductor device in the direction B1-B2 of FIG. 1 during the manufacturing.
Figure 2B:
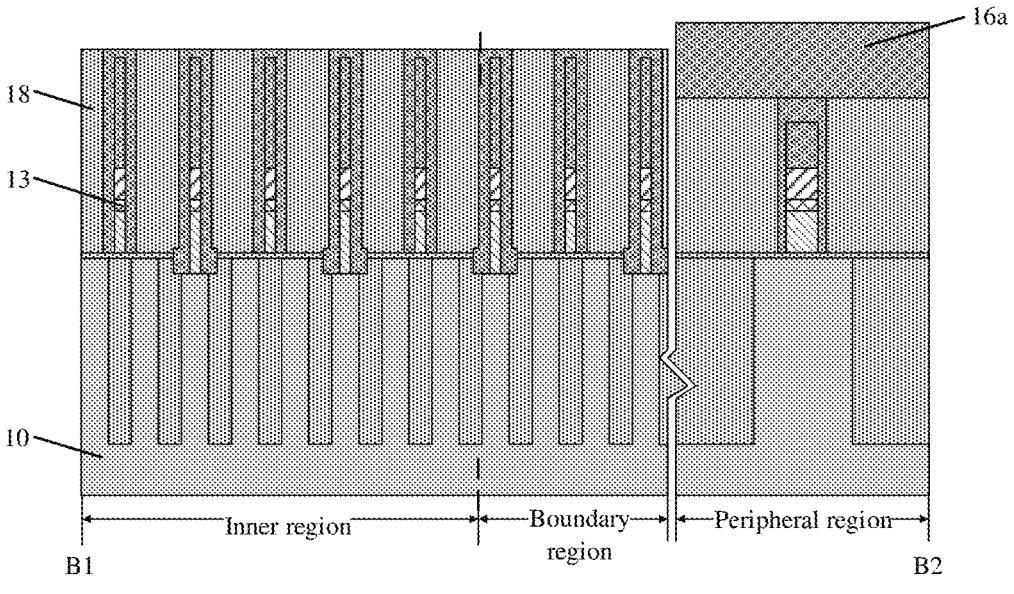
Figure 2C:
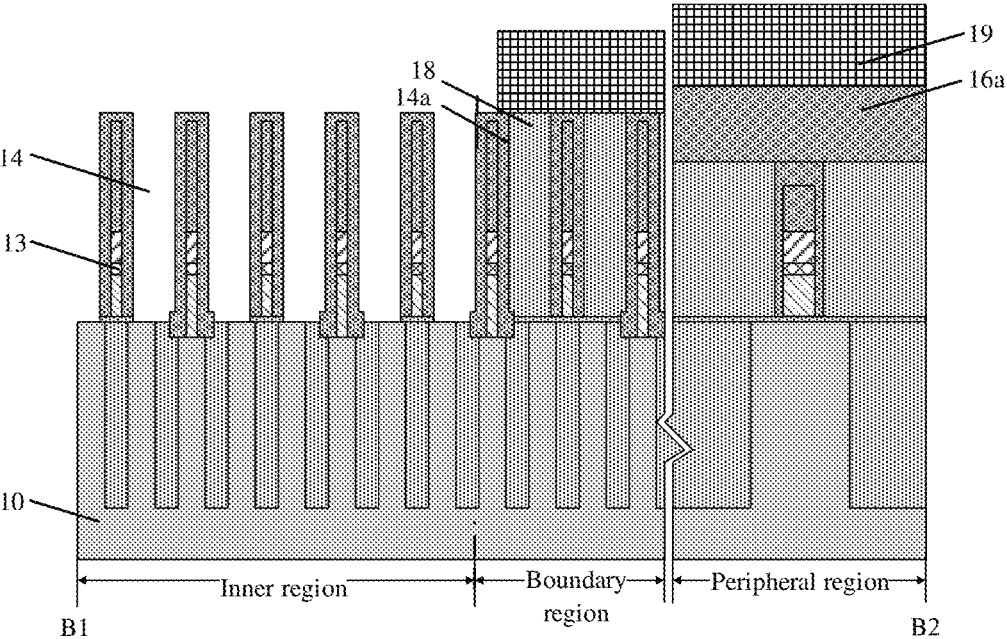
Figure 2D:
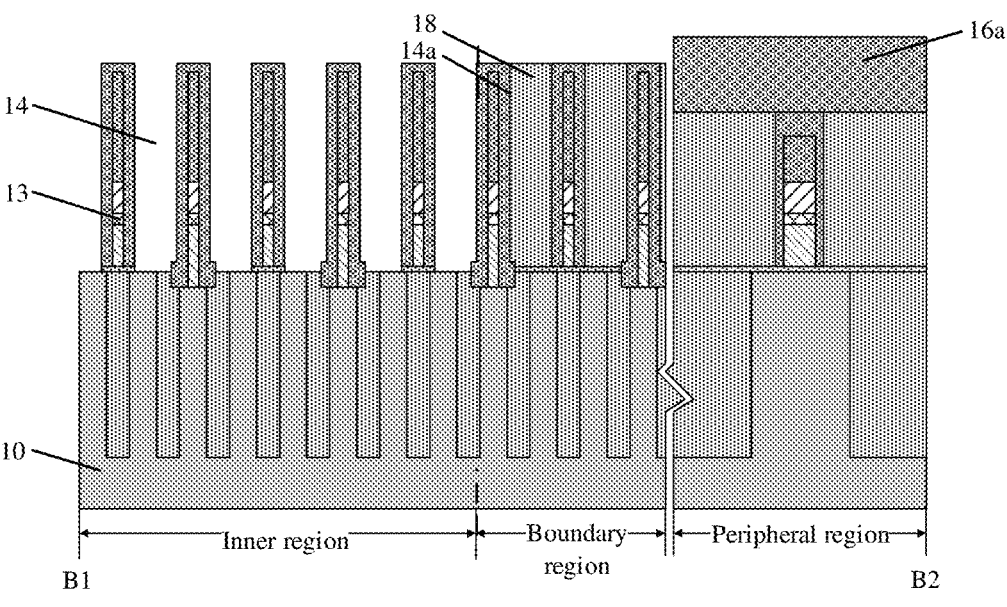

In order to improve the consistency of the node contact holes, reference is made to a method for manufacturing an exemplary semiconductor device provided in FIGS. 1-2D. In the method, when the node contact holes are formed, the node contact holes originally to be formed in the boundary region are made into dummy contact holes, which do not serve as part of the circuit, so that the consistency of the node contact holes can be improved. FIG. 1 is a top-view schematic diagram of an exemplary semiconductor device. FIGS. 2A-2D are detailed sectional views of the exemplary semiconductor device in the direction B1-B2 of FIG. 1 during the manufacturing.

First, as shown in FIGS. 1 and 2A, a substrate 10 is provided. The substrate 10 includes a memory array region and a peripheral region. The memory array region includes an inner region and a boundary region. A plurality of bit lines 13 are formed in the memory array region. A first insulating material 18 is filled among the plurality of bit lines 13. A cap material layer 16 is also formed above the memory array region and the peripheral region.

As shown in FIG. 2B, a cap layer 16a covered only above the peripheral region is formed by etching the cap material layer 16.

A resist material layer (not shown in the figure) is formed above the memory array region and the peripheral region. A trim is performed on the resist material layer (not shown in the figure) to form a resist layer 19 above the boundary region of the memory array region and the peripheral region, as shown in FIG. 2C.

An etching process is performed on the inner region of the memory array region with the resist layer 19 as a mask to remove the first insulating material 18 in the inner region so as to form node contact holes 14 in the inner region, as shown in FIG. 2C.

Finally, as shown in FIG. 2D, the resist layer 19 is removed.

It can be seen that the first insulating material 18 in the boundary region of the memory array region is not removed and constitutes dummy contact holes 14a.

However, according to the above method for manufacturing the exemplary semiconductor device, when the node contact holes are formed, the etching of the cap material layer needs to be performed in a plasma etching apparatus, the formation of the resist layer needs to be performed in a gluing apparatus, a lithography apparatus and a developing apparatus, the removal of the first insulating material needs to be performed in a plasma etching apparatus, and the removal of the resist layer needs to be performed in a wet cleaning apparatus. That is to say, the method for manufacturing the exemplary semiconductor device needs to be performed in and transferred among the multiple apparatus, which increases the complexity of the process and reduces the production efficiency.

Based on this, the following technical solutions of the embodiments of the disclosure are proposed.

Figure 3:
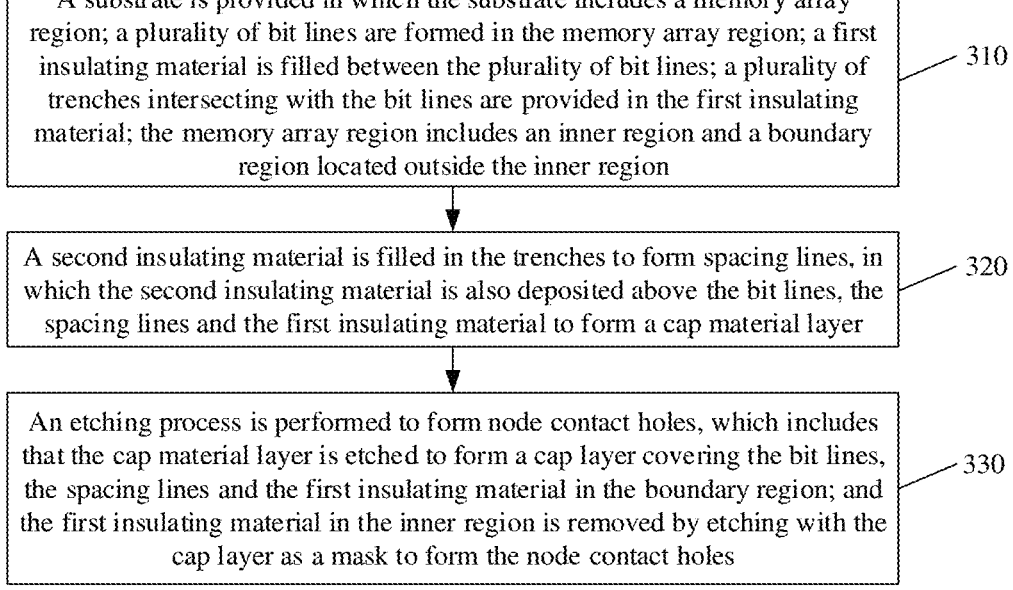
FIG. 3 is a flowchart of a method for manufacturing a semiconductor device provided by an embodiment of the disclosure.

Embodiments of the disclosure provide a method for manufacturing a semiconductor device. Reference is made to FIG. 3 for details. As shown in FIG. 3, the method includes the following operations.

In S310, a substrate is provided. The substrate includes a memory array region. A plurality of bit lines are formed in the memory array region. A first insulating material is filled between the plurality of bit lines. A plurality of trenches intersecting with the bit lines are provided in the first insulating material. The memory array region includes an inner region and a boundary region located outside the inner region.

In S320, a second insulating material is filled in the trenches to form spacing lines. The second insulating material is also deposited above the bit lines, the spacing lines and the first insulating material to form a cap material layer.

In S330, an etching process is performed to form node contact holes, which includes the following operations. The cap material layer is etched to from a cap layer covering the bit lines, the spacing lines and the first insulating material in the boundary region. The first insulating material in the inner region is removed by etching with the cap layer as a mask to from the node contact holes.

According to the embodiments of the disclosure, a process flow of the node contact holes is optimized, so that the final operations of etching to form the node contact holes can be performed in a same process and in a same machine, which can save the purchasing cost of the machines and improve the output efficiency of the chips.

In order to enable the above objects, features and advantages of the disclosure more readily understood, the specific implementations of the disclosure will be described in detail below in combination with the accompany drawings. In detailing the embodiments of the disclosure, for ease of illustration, schematic diagrams will be partially enlarged not in accordance with the normal scale. The schematic diagrams are only examples, and shall not limit the protection scope of the disclosure here.

Figure 4:
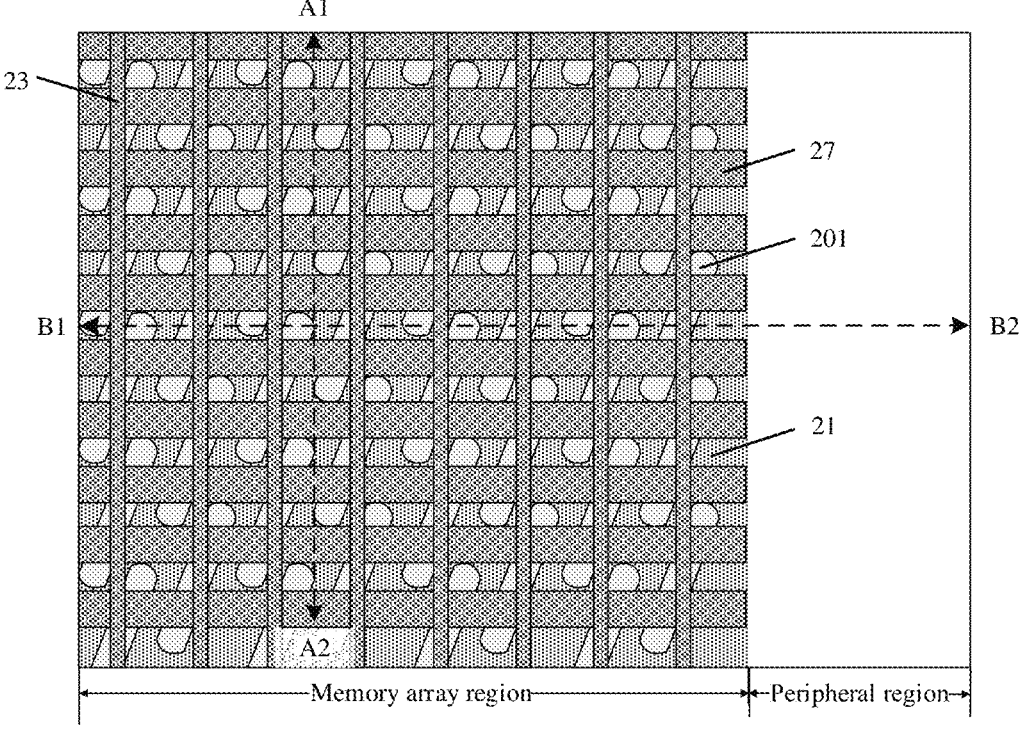
FIG. 4 is a top view schematic diagram of a semiconductor device provided by an embodiment of the disclosure.

FIG. 4 is a top view schematic diagram of a semiconductor device provided by an embodiment of the disclosure. FIGS. 5A, 6A, 7A, 8A, 9A and 10A are detailed sectional views of a semiconductor device provided by an embodiment of the disclosure in the direction A1-A2 of FIG. 4 during the manufacturing, and FIGS. 5B, 6B, 7B, 8B, 9B and 10B are detailed sectional views of a semiconductor device provided by an embodiment of the disclosure in the direction B1-B2 of FIG. 4 during the manufacturing.

Figure 5A:
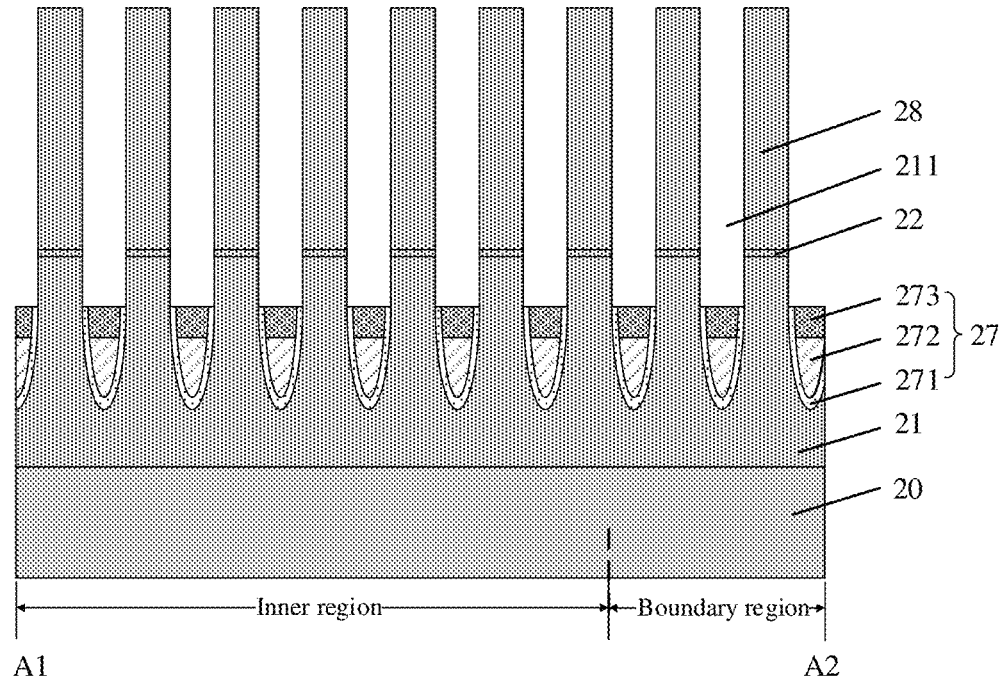
FIGS. 5A, 6A, 7A, 8A, 9A and 10A are detailed sectional views of a semiconductor device provided by an embodiment of the disclosure in the direction A1-A2 of FIG. 4 during the manufacturing.
Figure 5B:
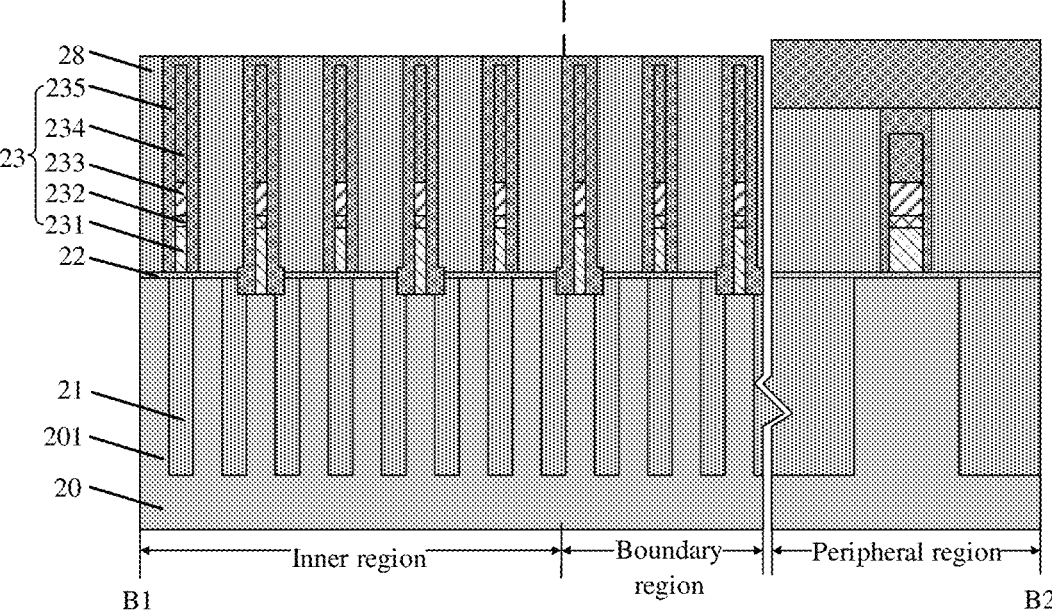
FIGS. 5B, 6B, 7B, 8B, 9B and 10B are detailed sectional views of a semiconductor device provided by an embodiment of the disclosure in the direction B1-B2 of FIG. 4 during the manufacturing.

First, as shown in FIGS. 4, 5A and 5B, S310 is performed. A substrate 20 is provided. The substrate 20 includes a memory array region. The memory array region further includes an inner region and a boundary region located outside the inner region. A plurality of bit lines 23 are formed in the memory array region. A first insulating material 28 is filled between the plurality of bit lines 23. The first insulating material 28 includes, but is not limited to, a material such as silicon oxide.

The substrate 20 may also include a peripheral region adjacent to the memory array region.

The substrate may be a semiconductor substrate which specifically includes at least one elemental semiconductor material (for example, silicon (Si) substrate, germanium (Ge) substrate, etc.), at least one III-V compound semiconductor material (for example, gallium nitride (GaN) substrate, gallium arsenide (GaAs) substrate, indium phosphide (InP) substrate, etc.), at least one II-VI compound semiconductor material, at least one organic semiconductor material, or other semiconductor materials known in the art. In a specific embodiment, the substrate is a silicon substrate.

A plurality of active areas 201 are provided in the substrate 20. An insulating spacer 21 is filled between the plurality of active areas 201. A material of the insulating spacer 21 includes, but is not limited to, a material such as silicon oxide.

In an embodiment, each of the bit lines 23 may include a polysilicon layer 231, an anti-diffusion barrier layer 232, and a metal layer 233 stacked sequentially from bottom to top. A material for forming the anti-diffusion barrier layer 232 includes, but is not limited to, titanium nitride. A material for forming the metal layer 233 includes, but is not limited to, metallic tungsten, a metallic silicide, tungsten nitride, etc.

It should be understood that a dielectric layer 22 may also be formed above the substrate 20 before forming the bit lines 23. The dielectric layer 22 is used to electrically isolate the substrate 20 from other structures formed on the substrate 20.

In a practical process, each of the bit lines 23 may also include a bit line cap layer 234 on a top of the metal layer 233 and an sidewall 235 covering the surfaces of the polysilicon layer 231, the anti-diffusion barrier layer 232, the metal layer 233 and the bit line cap layer 234. The bit line cap layer 234 and the sidewall 235 may be used to maintain electrical insulation of the polysilicon layer 231, the anti-diffusion barrier layer 232 and the metal layer 233 from other structures. Here, materials for forming the bit line cap layer 234 and the sidewall 235 may be the same. Specifically, materials for forming the bit line cap layer 234 and the sidewall 235 include, but are not limited to, silicon nitride, silicon carbide etc.

In some embodiments, the memory array region may also include word lines 27 embedded in the substrate 20. Each of the word lines 27 includes a gate dielectric layer 271, a conductive layer 272 and a word line cap layer 273 stacked sequentially from bottom to top. A material layer for forming the conductive layer 272 includes, but is not limited to, a polysilicon layer and a metal layer. A material for forming the metal layer includes, but is not limited to, metallic tungsten, a metallic silicide, tungsten nitride, etc. A material for forming the word line cap layer 273 may be the same as the material for forming the bit line cap layer 234 and will not be repeated here.

Referring to FIG. 5A again, a plurality of trenches 211 are provided in the first insulating material 28. In a practical process, the trenches 211 intersect the bit lines 23 and are located above the word lines 27.

Figure 6A:
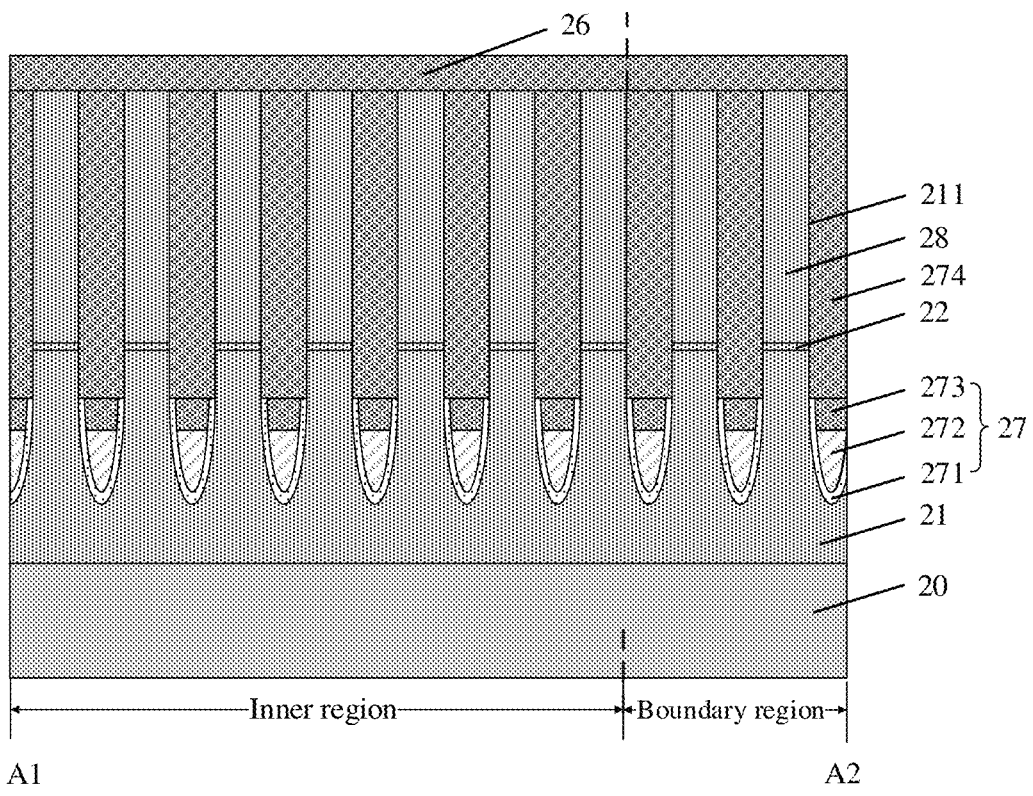
Figure 6B:
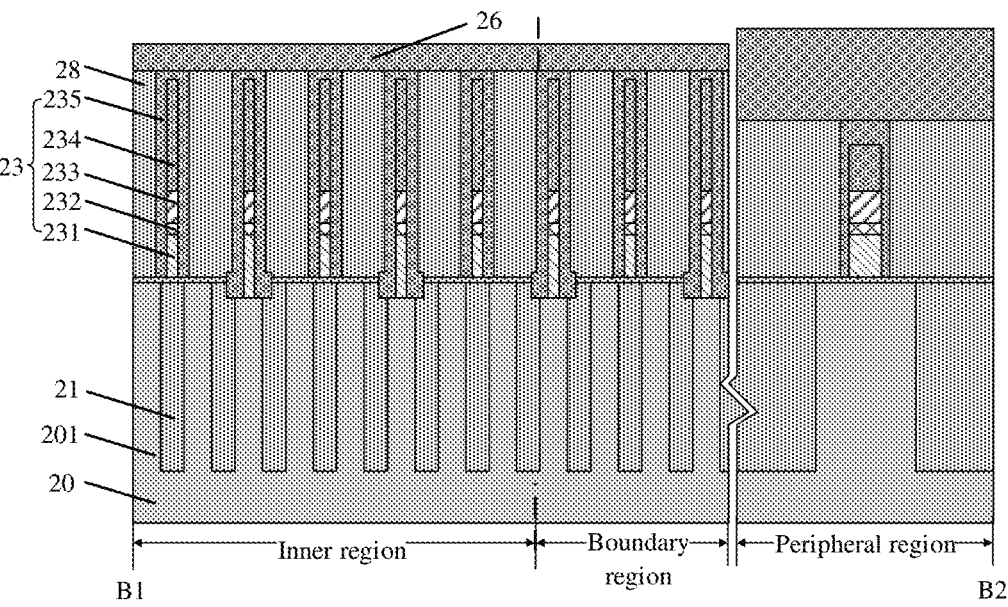

S320 is performed. As shown in FIGS. 6A to 6B, a second insulating material is filled in the trenches 211 to form spacing lines 274. The second insulating material is also deposited above the bit lines 23, the spacing lines 274 and the first insulating material 28 to form a cap material layer 26. Optionally, a thickness of the cap material layer 26 ranges between 12 nm and 20 nm, for example, 15 nm and 18 nm.

It is to be understood that the cap material layer 26 may also be deposited above the peripheral region.

The second insulating material includes, but is not limited to, silicon oxide, silicon nitride, silicon carbide, etc. In a specific embodiment, the second insulating material is silicon nitride.

A deposition process of the second insulating material includes, but is not limited to, a chemical vapor deposition (CVD) process, a plasma enhanced chemical vapor deposition (PECVD) process, an atomic layer deposition (ALD) process, or a combination thereof.

Thus, the bit lines 23 and the spacing lines 274 intersect to define areas where the first insulating material 28 is located in the memory array region.

S330 is performed. As shown in FIGS. 8A to 10B, an etching process is performed to form node contact holes 24, which includes the following operations. The cap material layer 26 is etched to form a cap layer 26a. The cap layer 26a is located above the bit lines 23, the spacing lines 274 and the first insulating material 28 in the boundary region, as shown in FIGS. 8A to 9B. An etching process is performed on the first insulating material 28 with the cap layer 26a as a mask to remove the first insulating material 28 in the inner region, so as to form the node contact holes 24, as shown in FIGS. 10A and 10B.

The first insulating material 28 in the boundary region of the memory array region is not removed and constitutes dummy contact holes 24a.

In the operation, the node contact holes are only formed in the inner region of the memory array region. Because the inner region is less affected by Pattern Loading Effects, the consistency of the formed node contact holes is good, which is beneficial to subsequent formation of a semiconductor device with a good electrical quality. Moreover, the operation can be performed in a same process and in a same machine, which can save the purchasing cost of the machines and improve the output efficiency of the chips. In an embodiment, the same machine may be, for example, a plasma etching apparatus. In other words, in the embodiment of the disclosure, the etching processes of the cap material layer and the first insulating material are performed in the plasma etching apparatus. It is to be understood that, when the materials etched are different, it is only necessary to change a type of etching gas introduced into the plasma etching apparatus and optimize etching parameters. For example, when the material of the cap material layer is silicon nitride, and the first insulating material is silicon oxide, a mixed gas containing carbon fluoride ($CF_4$) and argon (Ar) is used to etch the cap material layer, and a mixed gas containing hydrogen fluoride (HF) and nitrogen trifluoride ($NF_3$) is used to remove the first insulating material.

Figure 7A:
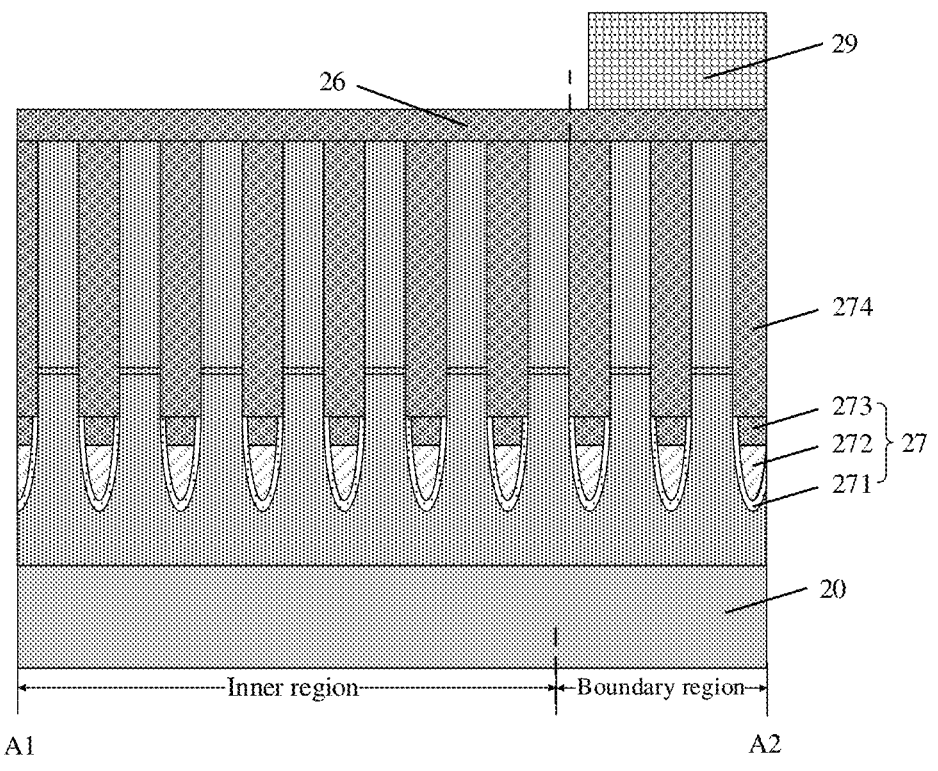
Figure 7B:
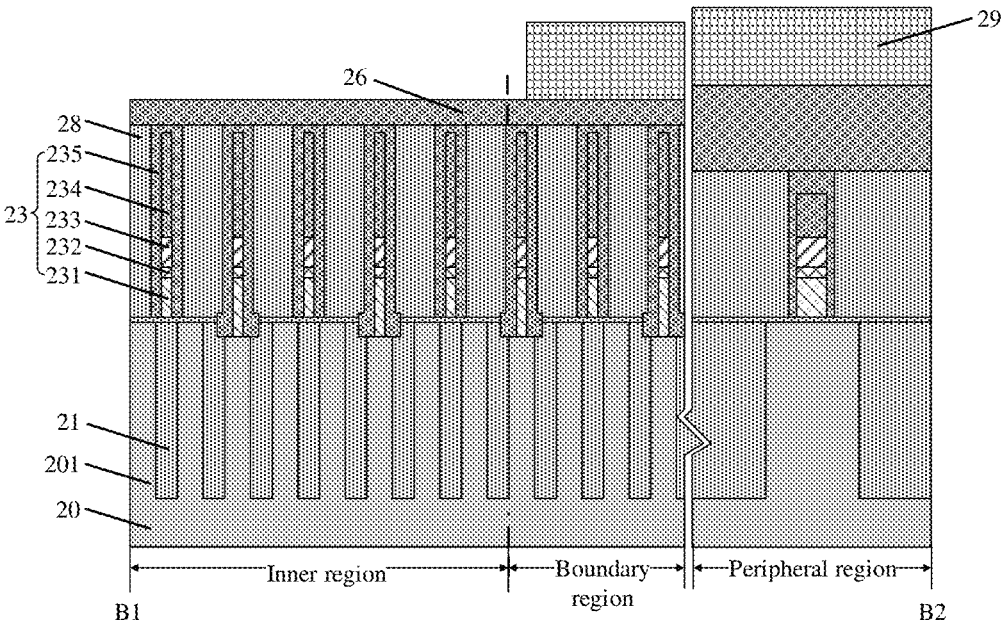

In an embodiment, as shown in FIGS. 7A to 7B, the method further includes forming a resist layer 29 on the cap material layer 26 in the boundary region before performing the etching process. Specifically, the resist layer 29 may be a photoresist layer. In some embodiments, the resist layer 29 is also formed above the peripheral region.

A process for forming the cap layer 26a will be described in detail below with reference to FIGS. 8A to 9B.

Figure 8A:
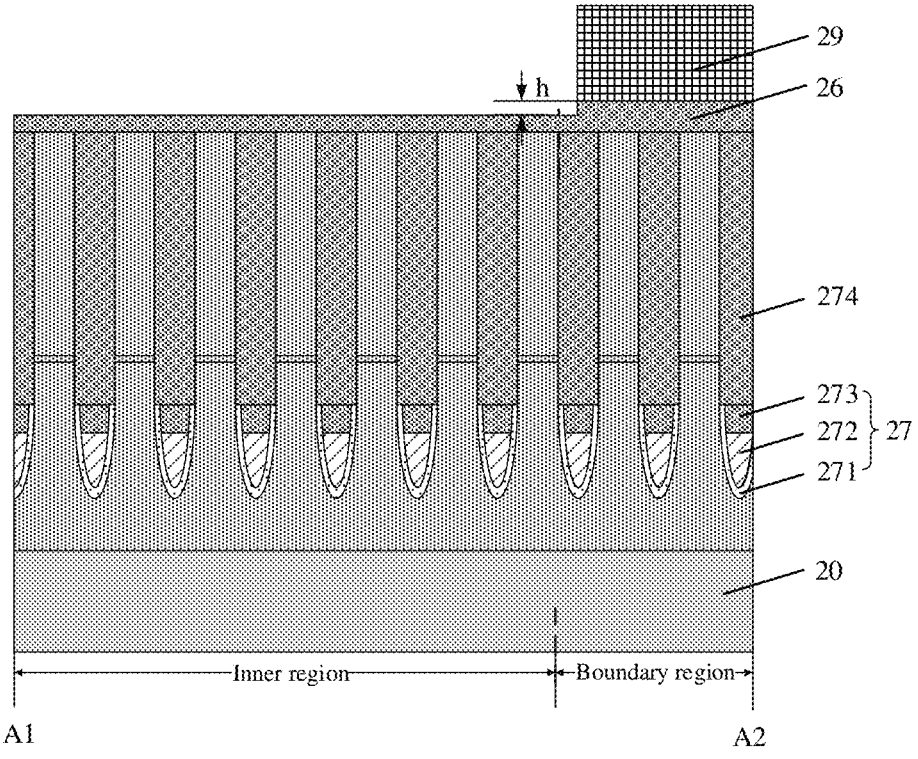
Figure 8B:
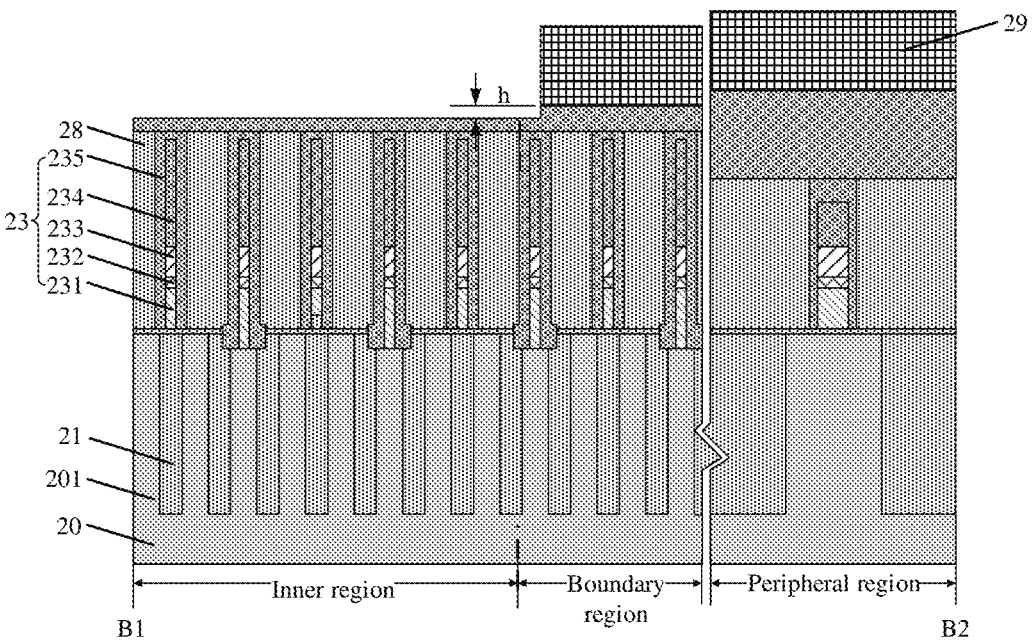

Firstly, as shown in FIGS. 8A to 8B, the cap material layer 26 in the inner region is thinned by an etching process with the resist layer 29 as a mask, so that a preset height difference h is formed between the cap material layer 26 in the inner region and the cap material layer in the boundary region. Specifically, the cap material layer 26 is thinned by a plasma etching process. In a specific embodiment, the cap material layer is thinned with a plasma etching gas containing carbon fluoride ($CF_4$) and argon (Ar). Optionally, a flow rate of the carbon fluoride ($CF_4$) is 200 sccm, and a flow rate of the argon gas is 400 sccm.

Figure 9A:
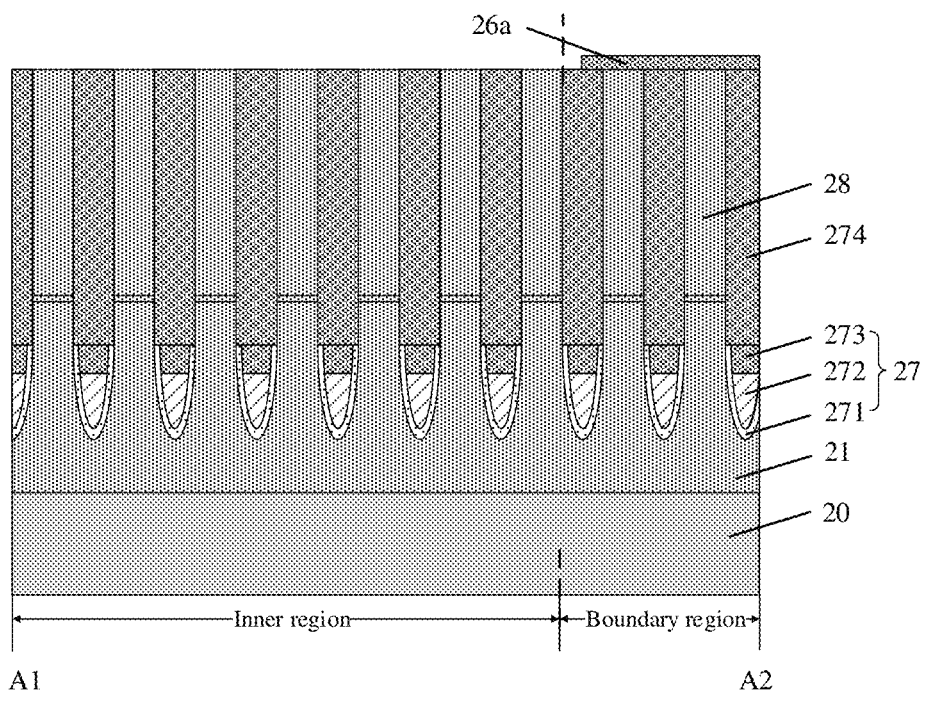
Figure 9B:
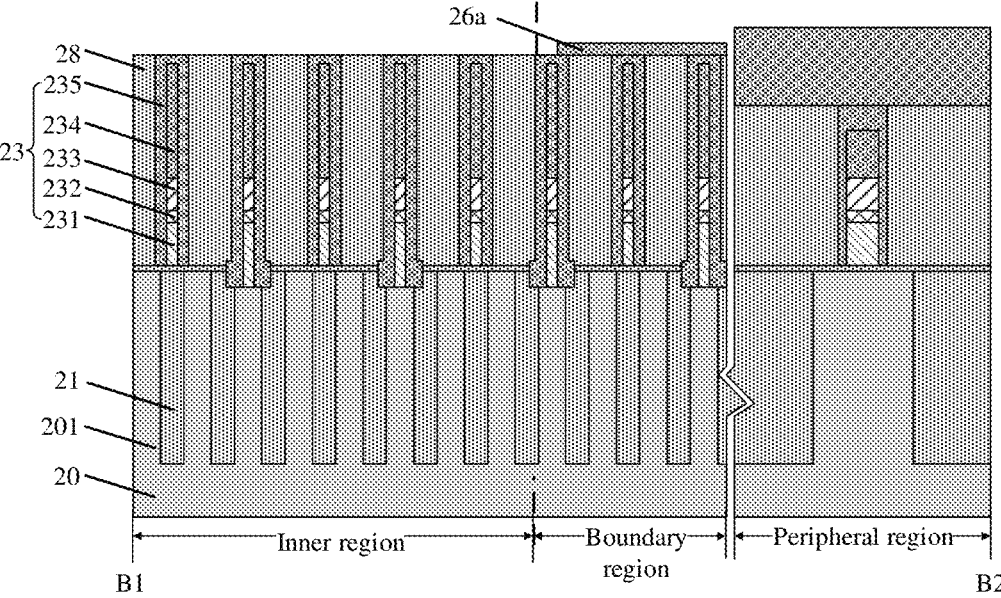
Figure 10A:
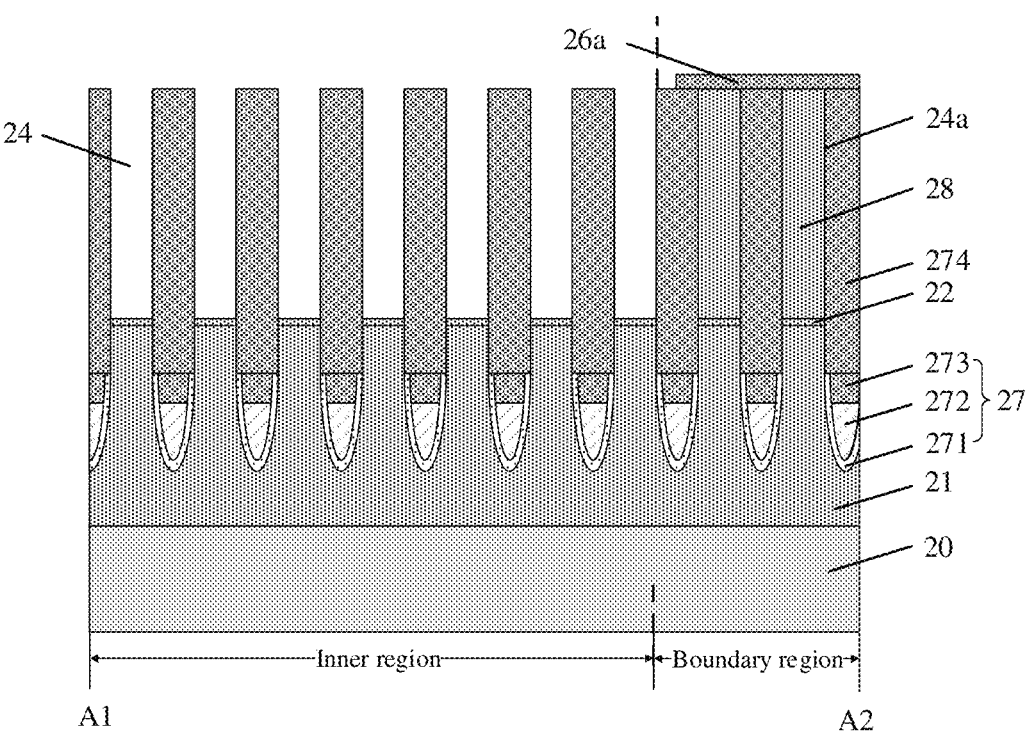
Figure 10B:
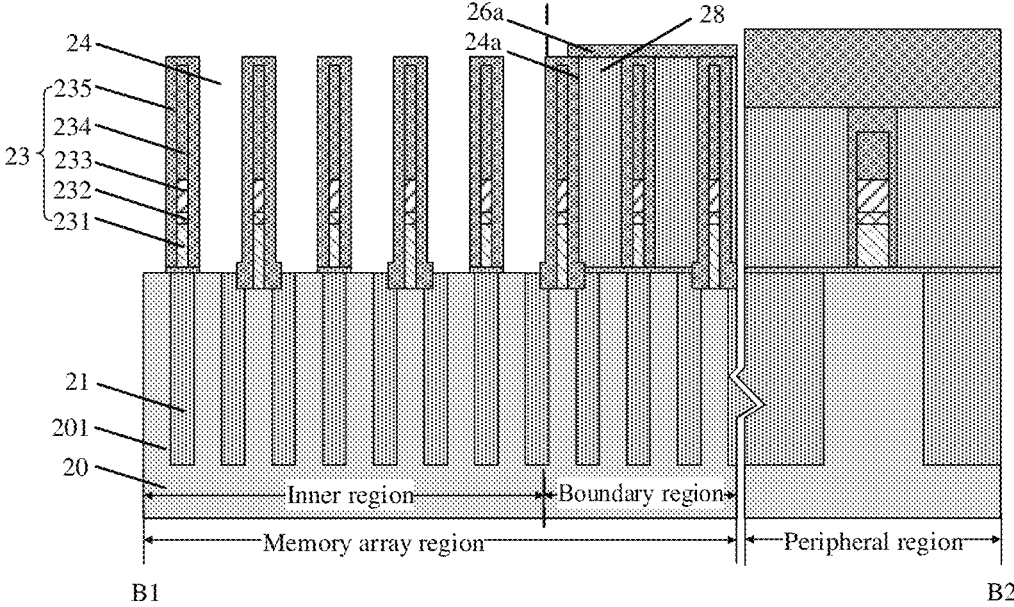

As shown in FIGS. 9A to 9B, the resist layer 29 is removed by etching. Specifically, the resist layer 29 is removed by a plasma etching process. In a specific embodiment, the resist layer 29 is removed with a plasma etching gas containing oxygen ($O_2$) at a temperature of 200° C.

The cap material layer 26 is further etched to remove the cap material layer 26 above the bit lines 23, the spacing lines 274 and the first insulating material 28 in the inner region, so as to form a cap layer 26a covering the bit lines 23, spacing lines 274 and the first insulating material 28 in the boundary region. Specifically, the cap material layer 26 is etched by a plasma etching process. In a specific embodiment, a plasma etching gas containing carbon fluoride ($CF_4$) and argon (Ar) is used to etch to form the cap layer 26a. Optionally, a flow rate of the carbon fluoride ($CF_4$) is 200 sccm, and a flow rate of the argon gas is 400 sccm.

It is to be understood that after forming the cap layer 26a, the first insulating material 28 in the inner region is removed with the cap layer 26a as a mask. Specifically, the first insulating material 28 is removed by a plasma etching process. In a specific embodiment, the first insulating material 28 is removed with a plasma etching gas containing hydrogen fluoride (HF) and nitrogen trifluoride (NF3) at a temperature of 80° C.

In some embodiments, the preset height difference ranges between 6 nm and 10 nm. The preset height difference can be used to ensure that the first insulating material 28 in the boundary region is not exposed during subsequent etching of the cap material layer.

According to some embodiments, the method further includes filling a conductive material in the node contact holes 24 to form node contact plugs. The conductive material for forming the node contact plugs includes, but is not limited to, a polysilicon layer and a metal layer. A material for forming the metal layer includes, but is not limited to, metallic tungsten, a metallic silicide (such as $TiSi_2$, $CoSi_2$ and $NiSi_2$), tungsten nitride, etc.

In embodiments of the disclosure, etching to remove the resist layer, etching to form the cap layer and etching to form the node contact holes can be done in a same machine and in a same process in the operations of etching to form the node contact holes. Therefore, according to the embodiments of the disclosure, the process flow for forming the node contact holes is optimized, and the utilization rate of the machine is improved, thus saving the purchasing cost of the machines, and improving the output efficiency of the chips.

Embodiments of the disclosure also provide a semiconductor device, as shown in FIGS. 10A to 10B. The semiconductor device includes a substrate 20, a plurality of bit lines 23, a plurality of spacing lines 274, a first insulating material 28 and a cap layer 26a.

The substrate 20 includes a memory array region. The memory array region includes an inner region and a boundary region located outside the inner region. The plurality of bit lines 23 are located in the memory array region. The plurality of spacing lines 274 are located in the memory array region and intersect with the plurality of bit lines 23 to form a plurality of hole structures. The hole structures in the inner region are node contact holes 24. The first insulating material 28 is filled in the hole structures in the boundary region. A cap layer 26a covers the bit lines 23, the spacing lines 274, and the first insulating material 28 in the boundary region.

The first insulating material 28 is filled in the hole structures in the boundary region to constitute dummy contact holes 24a. The first insulating material 28 includes, but is not limited to, a material such as silicon oxide. Optionally, the first insulating material 28 is silicon oxide.

According to some embodiments, a thickness of the cap layer 26a is between 6 nm and 10 nm. A material for forming the cap layer 26a includes, but is not limited to, silicon oxide, silicon nitride, silicon carbide, etc. Specifically, the material is silicon nitride.

The cap layer 26a can protect the structures beneath it from damage and contamination by subsequent processes. In addition, when node contact plugs and landing pads above the node contact plugs is subsequently formed in the inner region, the cap layer 26a can reduce a height difference between the inner region and the boundary region, which is beneficial to performing subsequent processes stably.

It is to be understood that a material for forming the spacing lines 274 may be the same as a material for forming the cap layer 26a, such as silicon oxide, silicon nitride, silicon carbide, etc. Optionally, the materials are silicon nitride.

In a practical process, the cap layer 26a and the spacing lines 274 may be formed by one or more thin film deposition processes. The various thin film deposition processes include, but are not limited to, a chemical vapor deposition (CVD) process, a plasma enhanced chemical vapor deposition (PECVD) process, an atomic layer deposition (ALD) process, or a combination thereof.

In addition, the semiconductor device also includes a peripheral region adjacent to the boundary region of the memory array region. In a practical process, the cap layer 26a is also covered above the peripheral region.

The substrate 20 also includes a plurality of active areas 201 and an insulating spacer 21 filled between the active areas 201. A material of the insulating spacer 21 includes, but is not limited to, a material such as silicon oxide.

Referring to FIG. 10B, each of the bit lines 23 may include a polysilicon layer 231, an anti-diffusion barrier layer 232, and a metal layer 233 stacked sequentially from bottom to top. A material for forming the anti-diffusion barrier layer 232 includes, but is not limited to, a material such as titanium nitride. A material for forming the metal layer 233 includes, but is not limited to, metallic tungsten, a metallic silicide, tungsten nitride, etc.

In some embodiments, each of the bit lines 23 may also include a bit line cap layer 234 on a top of the metal layer 233 and a sidewall 235 covering the surfaces of the polysilicon layer 231, the anti-diffusion barrier layer 232, the metal layer 233 and the bit line cap layer 234. The bit line cap layer 234 and the sidewall 235 can be used to maintain electrical insulation of the polysilicon layer 231, the anti-diffusion barrier layer 232 and the metal layer 233 from other structures. A material of the sidewall 235 includes, but is not limited to, silicon nitride, silicon carbide, etc.

It is to be understood that a dielectric layer 22 is also formed between the bit lines 23 and the substrate 20. The dielectric layer 22 is used to electrically isolate the bit lines 23 from the substrate 20.

In some embodiments, as shown in FIG. 10A, the semiconductor device may also include word lines 27 embedded in the substrate 20 and located below the spacing lines 274. Each of the word lines 27 includes a gate dielectric layer 271, a conductive layer 272 and a word line cap layer 273 stacked sequentially from bottom to top. A material for forming the conductive layer 272 includes, but is not limited to, a polysilicon layer and a metal layer, etc. A material for forming the metal layer includes, but is not limited to, metallic tungsten, a metallic silicide, tungsten nitride, etc.

According to some embodiments, a conductive material may be disposed in the node contact holes 24 to constitute node contact plugs which are used to achieve electrical connection between the information storage structures and the active areas 201. The conductive material for forming the node contact plugs includes, but is not limited to, a polysilicon layer and a metal layer. A material for forming the metal layer includes, but is not limited to, metallic tungsten, a metallic silicide (such as $TiSi_2$, $CoSi_2$, and $NiSi_2$, etc.), tungsten nitride, etc.

It is to be noted that, the method for manufacturing a semiconductor device provided by the embodiments of the disclosure can be applied to DRAM structures or other semiconductor devices, which is not limited too much herein. The embodiments of the method for manufacturing a semiconductor device provided by the disclosure and the embodiments of the semiconductor device belong to a same concept. The technical features in the technical solutions recited in each embodiment can be arbitrarily combined without conflict.

The above is only the preferred embodiments of the disclosure, and is not intended to limit the protection scope of the disclosure. Any modification, equivalent replacement and improvement, etc. made within the spirit and principle of the disclosure shall be included in the protection scope of the disclosure.

INDUSTRIAL PRACTICALITY

According to the embodiments of the disclosure, the process flow of the node contact holes is optimized, so that the final operations of etching to form the node contact holes can be performed in the same process and in the same machine, which can save the purchasing cost of the machines and improve the output efficiency of the chips.

The invention claimed is:

1. A semiconductor device, comprising:
a substrate, wherein the substrate comprises a memory array region and a peripheral region, wherein the memory array region comprises an inner region and a boundary region located outside the inner region, the peripheral region adjacent to the boundary region of the memory array region;
a plurality of bit lines located in the memory array region;
a plurality of spacing lines located in the memory array region and intersecting with the plurality of bit lines to form a plurality of hole structures, wherein the hole structures located in the inner region are node contact holes;
a first insulating material filled in the hole structures in the boundary region; and
a cap layer covering the bit lines, the spacing lines, and the first insulating material in the boundary region; wherein the cap layer further covers the peripheral region, and the top surface of the cap layer in the peripheral region is higher than the top surface of the cap layer in the boundary region.

2. The semiconductor device of claim 1, wherein the first insulating material comprises silicon oxide, and a material of the cap layer comprises silicon nitride.

3. The semiconductor device of claim 1, wherein a thickness of the cap layer ranges between 6-10 nm.

4. The semiconductor device of claim 1, further comprising: a plurality of word lines embedded in the substrate and located below the spacing lines.

5. The semiconductor device of claim 1, wherein a material of the spacing lines is same as a material of the cap layer.

6. The semiconductor device of claim 1, further comprising: a conductive material disposed in the node contact holes to form node contact plugs.

* * * * *